US009450052B1

(12) United States Patent
Bergemont et al.

(10) Patent No.: US 9,450,052 B1
(45) Date of Patent: Sep. 20, 2016

(54) EEPROM MEMORY CELL WITH A COUPLER REGION AND METHOD OF MAKING THE SAME

(71) Applicant: Monolithic Power Systems, Inc., San Jose, CA (US)

(72) Inventors: Albert Bergemont, Palo Alto, CA (US); Eric Braun, Mountain View, CA (US); Joel M. McGregor, Issaquah, WA (US)

(73) Assignee: CHENGDU MONOLITHIC POWER SYSTEMS CO., LTD., Chengdu (CN)

( * ) Notice: Subject to any disclaimer, the term of this patent is extended or adjusted under 35 U.S.C. 154(b) by 0 days.

(21) Appl. No.: 14/789,952

(22) Filed: Jul. 1, 2015

(51) Int. Cl.
*H01L 29/10* (2006.01)
*H01L 29/788* (2006.01)
*H01L 29/66* (2006.01)

(52) U.S. Cl.
CPC ..... *H01L 29/1095* (2013.01); *H01L 29/66825* (2013.01); *H01L 29/7883* (2013.01); *H01L 29/7887* (2013.01)

(58) Field of Classification Search
CPC ............... H01L 29/1095; H01L 29/66825; H01L 29/788–29/7889
See application file for complete search history.

(56) References Cited

U.S. PATENT DOCUMENTS

| | | | | | |
|---|---|---|---|---|---|
| 4,649,520 A | * | 3/1987 | Eitan | ................ | H01L 29/7885 257/318 |
| 4,652,897 A | * | 3/1987 | Okuyama | .......... | H01L 29/7885 257/316 |
| 5,225,700 A | * | 7/1993 | Smayling | ............ | H01L 29/7883 257/321 |
| 5,587,945 A | * | 12/1996 | Lin | .................... | G11C 16/0441 257/E27.103 |
| 5,615,150 A | * | 3/1997 | Lin | .................... | G11C 16/0441 257/E27.103 |
| 5,640,346 A | * | 6/1997 | Preslar | ............... | G11C 16/0408 257/315 |
| 5,969,992 A | * | 10/1999 | Mehta | ................ | G11C 16/0433 257/E21.694 |
| 6,034,893 A | * | 3/2000 | Mehta | ................ | G11C 16/0441 257/318 |
| 6,130,840 A | * | 10/2000 | Bergemont | ......... | G11C 11/5621 257/E27.103 |
| 6,215,700 B1 | * | 4/2001 | Fong | .................. | G11C 16/0433 257/314 |
| 6,232,631 B1 | * | 5/2001 | Schmidt | ............ | G11C 16/0441 257/315 |
| 6,274,898 B1 | * | 8/2001 | Mehta | ................ | G11C 16/0441 257/295 |
| 6,294,810 B1 | * | 9/2001 | Li | ........................ | H01L 27/115 257/314 |
| 6,326,663 B1 | * | 12/2001 | Li | ........................ | H01L 27/115 257/318 |
| 6,404,006 B2 | * | 6/2002 | Li | ...................... | G11C 16/0441 257/320 |
| 6,507,516 B1 | * | 1/2003 | Bergemont | .......... | G11C 27/005 257/E21.694 |
| 6,570,212 B1 | * | 5/2003 | Mehta | .................. | H01L 27/105 257/314 |
| 7,436,710 B2 | * | 10/2008 | Ratnakumar | ...... | G11C 16/0441 257/E21.694 |
| 7,542,342 B2 | * | 6/2009 | Kalnitsky | .......... | G11C 16/0433 365/185.03 |
| 7,869,279 B1 | * | 1/2011 | Ratnakumar | ..... | H01L 21/28273 257/296 |
| 7,898,852 B1 | * | 3/2011 | Levy | .................. | G11C 16/0466 365/185.03 |

(Continued)

*Primary Examiner* — Matthew Landau
*Assistant Examiner* — Grant Withers

(57) ABSTRACT

An EEPROM memory cell with a coupler region is disclosed. The coupler region has a well and at least one feeder region formed in the well. The at least one feeder region is configured to provide majority carriers to a channel region defined in the well so that a portion of the channel region adjoining the top surface of the coupler region is inverted during an erase operation.

20 Claims, 3 Drawing Sheets

(56) References Cited

U.S. PATENT DOCUMENTS

| | | | | |
|---|---|---|---|---|
| 7,944,750 B1* | 5/2011 | Bergemont | G11C 16/10 | 365/185.03 |
| 8,076,707 B1* | 12/2011 | Hyde | H01L 27/11519 | 257/314 |
| 8,183,621 B2* | 5/2012 | Babcock | H01L 21/28273 | 257/315 |
| 8,975,679 B1* | 3/2015 | Chen | H01L 27/11558 | 257/298 |
| 8,975,685 B2* | 3/2015 | He | G11C 16/0408 | 257/315 |
| 9,001,580 B1* | 4/2015 | Horch | H01L 27/11521 | 365/149 |
| 2002/0005543 A1* | 1/2002 | Di Pede | H01L 27/115 | 257/314 |
| 2004/0070030 A1* | 4/2004 | Chindalore | H01L 29/66825 | 257/336 |
| 2004/0099914 A1* | 5/2004 | Yang | H01L 29/7883 | 257/390 |
| 2004/0206999 A1* | 10/2004 | Hyde | H01L 27/11519 | 257/312 |
| 2004/0233727 A1* | 11/2004 | Iwase | G11C 11/22 | 365/185.22 |
| 2005/0030827 A1* | 2/2005 | Gilliland | G11C 16/3404 | 365/232 |
| 2005/0270850 A1* | 12/2005 | Wang | G11C 16/0416 | 365/185.28 |
| 2006/0220096 A1* | 10/2006 | Wang | G11C 16/045 | 257/315 |
| 2007/0145459 A1* | 6/2007 | Park | H01L 27/115 | 257/314 |
| 2007/0158733 A1* | 7/2007 | Huang | G11C 16/0416 | 257/315 |
| 2008/0044973 A1* | 2/2008 | Kalnitsky | G11C 27/005 | 438/264 |
| 2008/0185627 A1* | 8/2008 | Horch | H01L 21/28273 | 257/315 |
| 2009/0201742 A1* | 8/2009 | Lee | G11C 16/0441 | 365/185.24 |
| 2010/0032744 A1* | 2/2010 | Mitros | H01L 29/0692 | 257/316 |
| 2013/0092991 A1* | 4/2013 | Liao | H01L 29/788 | 257/298 |
| 2013/0193501 A1* | 8/2013 | Horch | H01L 29/66825 | 257/298 |
| 2014/0209988 A1* | 7/2014 | Lin | H01L 29/66825 | 257/298 |
| 2014/0374812 A1* | 12/2014 | Ge | H01L 29/7881 | 257/316 |
| 2015/0221371 A1* | 8/2015 | Milani | G11C 16/0408 | 365/185.28 |
| 2015/0221661 A1* | 8/2015 | Milani | H01L 27/11521 | 257/321 |
| 2015/0311219 A1* | 10/2015 | Taniguchi | G11C 16/0441 | 257/300 |

* cited by examiner

EEPROM MEMORY CELL WITH A COUPLER REGION AND METHOD OF MAKING THE SAME

FIELD OF THE INVENTION

The present invention relates generally to electrically erasable programmable read only memory (EEPROM) cells, and more particularly but not exclusively to EEPROM memory cells with coupler regions.

BACKGROUND OF THE INVENTION

The electrically erasable programmable read only memory (EEPROM) cells with coupler regions are widely used in analog and mixed signal applications. The EEPROM memory cell generally comprises a floating gate, an oxide layer and a coupler region within which a coupler channel region is defined under the floating gate. The coupler channel region typically comprises an inversion layer and a depletion layer.

During an erase operation, an erase voltage is applied in the coupler region and is then capacitively coupled to the floating gate with a coupling ratio which is partly determined by the width of the depletion layer. In more detail, the wider the depletion layer is, the smaller the coupling ratio is. Take a P-type coupler region for example, the depletion layer is formed by removing the mobile holes and leaving the fixed ions in the space charge region. The depletion width expands until the inversion layer is formed by attracting the mobile electrons of the coupler region at the interface between the coupler region and the oxide layer. However, as the mobile electrons are minority carriers in the P-type coupler region, the formation of the inversion layer is slow, causing a wide depletion layer which, in turn, results in a small coupling ratio. Therefore, the time to erase the EEPROM memory cell is long, and the absolute value of the erase voltage is large. And in addition, the EEPROM memory cell may have a bad linearity of the final erase threshold voltage to the erase voltage for a short erase time.

Thus, an EEPROM memory cell having a large and time independent coupling ratio between the coupler region and the floating gate is desired.

SUMMARY

Embodiments of the present invention are directed to an EEPROM memory cell formed in a semiconductor body having a top surface. The EEPROM memory cell has a first well and a second well, a drain and a source, a second channel region, a floating gate and at least one feeder region. The first well and the second well are both adjacent to the top surface of the semiconductor body. The drain and the source are formed in the first well and spaced apart from each other. A first channel region is defined between the source and the drain. The second channel region is defined as extending from the top surface of the semiconductor body into the second well. The floating gate is insulatively formed over the first channel region and the second channel region and forms an uninterrupted conducting path extending from the second well to the first well. The at least one feeder region is formed in the second well. The at least one feeder region has a conductivity type opposite to that of the second well and provides majority carriers thereof to the second channel region so that the portion of the second channel region proximate the top surface of the semiconductor body is inverted during an erase operation.

Embodiments of the present invention are also directed to a method of fabricating an EEPROM memory cell having the steps of: providing a semiconductor body having a top surface; forming a first well and a second well adjoining the top surface of the semiconductor body, wherein a second channel region is defined as extending from the top surface of the semiconductor body into the second well; forming a drain and a source both within the first well, wherein the drain and the source are space-apart from each other and a first channel region is defined therebetween; forming at least one feeder region of a conductivity type opposite to that of the second well, wherein the at least one feeder region is formed inside the second well and is configured to provide majority carriers to the second channel region so that a portion of the second channel region adjoining the top surface of the semiconductor body is inverted during an erase operation; forming a floating gate over the first channel region and the second channel region, wherein the floating gate forms an uninterrupted conducting path from the second well to the first well.

DESCRIPTION OF THE DRAWINGS

The present invention can be further understood with reference to the following detailed description and the appended drawings, wherein like elements are provided with like reference numerals.

DESCRIPTION

Figure 1:
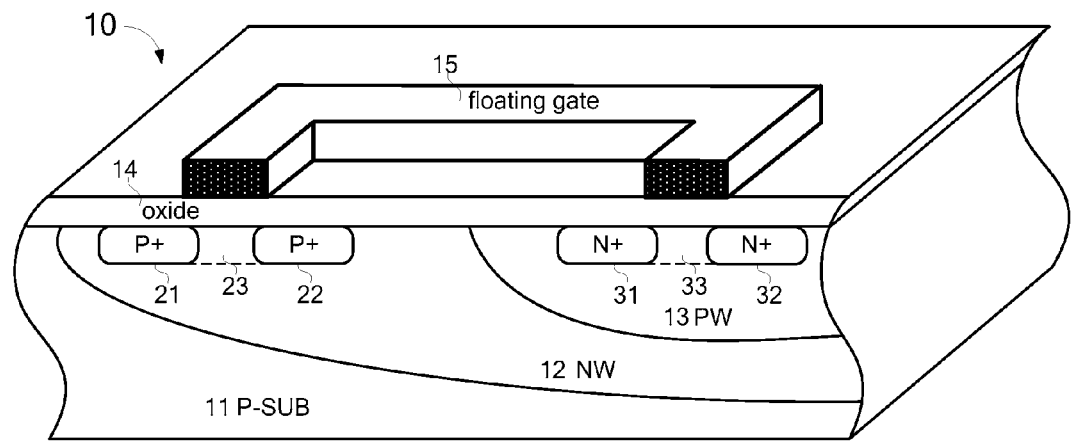
FIG. 1 illustrates a cross-sectional view of an EEPROM memory cell 10 in accordance with an embodiment of the present invention.

The present invention is now described. While it is disclosed in its preferred form, the specific embodiments of the invention as disclosed herein and illustrated in the drawings are not to be considered in a limiting sense. Rather, these embodiments are provided so that this invention will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. The following detailed description is, therefore, not to be taken in a limiting sense.

Throughout the specification, the meaning of "a," "an," and "the" may also include plural references.

As can be appreciated, the conductivity and doping of materials or regions disclosed herein may be varied, with appropriate changes to the conductivity and doping of other materials or regions, depending on the application.

FIG. 1 illustrates a cross-sectional view of an EEPROM memory cell 10 in accordance with an embodiment of the present invention. As shown in FIG. 1, the EEPROM memory cell 10 comprises a semiconductor body 11 (P-SUB), a first well 12 (NW), a drain 21 and a source 22, a second well 13 (PW), a first feeder region 31 and a second feeder region 32, an insulation layer 14 and a floating gate 15. For convenience of description, the first well 12, the drain 21 and the source 22 may be together referred to as a transistor region, while the second well 13, the first feeder region 31 and the second feeder region 32 may be together referred to as a coupler region herein after.

In the illustrated embodiment of FIG. 1, the semiconductor body 11 is of a P-type conductivity and has a top surface. In one embodiment, the semiconductor body 11 may comprise a substrate, an epitaxial layer, a buried layer or any appropriate structure and/or material.

Referring to FIG. 1, the first well 12 has an N-type conductivity and resides in the semiconductor body 11. The drain 21 and the source 22 are both of P-type conductivity and are formed in the first well 12. Further, the drain 21 and the source 22 are isolated from each other and a first channel region 23 (may be also referred to as a transistor channel region) is defined therebetween. The drain 21, the source 22 and the first channel region 23 together serve as a tunneling window to tunnel charges to and from the floating gate 15. In one embodiment, an n-type body contact region that may or may not be electrically shorted to the source 22 may be further formed in the first well 12, serving to bias the first well 12 depending on the operating conditions.

The second well 13 has a P-type conductivity and extends from the top surface of the semiconductor body 11 into the first well 12 and is thus isolated from the semiconductor body 11. A second channel region 33 (may be also referred to as a coupler channel region) is defined as extending from the top surface of the semiconductor body 11 into the second well 13. The first feeder region 31 and the second feeder region 32 are both of N-type conductivity and reside in the second well 13 in order to provide majority carriers thereof (electrons in the illustrated embodiment of FIG. 1) to the second channel region 33 so that the portion of the second channel region 33 adjoining the top surface of the semiconductor body 11 is inverted during an erase operation. More specifically, in the embodiment of FIG. 1, the feeder regions 31 and 32 extend from the top surface of the semiconductor body 11 into the second well 13 and are physically connected to the second channel region 33. Persons of ordinary skill in the art will recognize that, the feeder regions 31 and 32 are shown to extend from the top surface of the semiconductor body 11 into the second well 13 and to adjoin the second channel region 33 as set forth in the illustrated embodiment of FIG. 1, however, any other appropriate configuration of the feeder regions or the interconnection between the feeder regions and other regions may be implemented in order to accomplish the foregoing functionality of supplying majority carriers of the feeder regions to the second channel region for fast surface inversion. Persons of ordinary skill in the art will also recognize that in the embodiment illustrated in FIG. 1, the EEPROM memory cell 10 comprises two feeder regions 31 and 32, however, in another embodiment, the EEPROM memory cell 10 may comprise at least one feeder region, for example, only one of the feeder regions 31 and 32, or more than two feeder regions. The coupler region serves to control the voltage potential of the floating gate 15 through capacitive coupling.

The insulation layer 14, e.g., an oxide layer, is formed on the top surface of the semiconductor body 11 to provide support for the floating gate 15. The floating gate 15 is formed on the insulation layer 14 and over the transistor channel region 23 and the coupler channel region 33 and is configured to form an uninterrupted conducting path extending from the coupler region to the transistor region. The floating gate 15 is configured to transfer charges from or to the transistor region. In a preferred embodiment, the floating gate 15 laterally overlaps with a portion of the feeder region 31 as well as a portion of the feeder region 32 in addition to the coupler channel region 33 for necessity of manufacturability. In another embodiment, the floating gate 15 is further formed over a portion of the drain 21 as well as a portion of the source 22. In another preferred embodiment, the floating gate 15 connecting the transistor region with the coupler region is continuously doped with a P-type conductivity, except small regions over the feeder regions 31 and 32, due to the process steps of making the EEPROM memory cell. For example, when the process step of P-type doping the floating gate 15 is performed prior to the process step of N-type doping the feeder regions 31 and 32, the small regions of the floating gate 15 over the feeder regions 31 and 32 are override by the N-type doping. In an alternative embodiment, the portion of the floating gate 15 overlapping the first well 12 is P-type doped, while the left portion overlapping the second well 13 is N-type doped, as a result of the process steps of forming the EEPROM memory cell.

In addition to the above, at least one body contact region which has the same conductivity type as but more highly doped than the second well 13 may be further formed in the second well 13, as illustrated in the following FIG. 2 and FIG. 3, to facilitate electrical contact thereto and to bias the second channel region 33 under all operating conditions. The at least one body contact region extends from the top surface of the semiconductor body 11 into the second well 13 and is electrically shorted to the feeder regions 31 and 32.

Persons of ordinary skill in the art will recognize that in the embodiment of FIG. 1, the second well 13 is shown to be formed inside the first well 12 and thus isolated from the semiconductor body 11. However, in an alternative embodiment, the transistor region comprising a drain, a source and a well may be formed inside the well of the coupler region in contrast to the structure shown in FIG. 1. In another alternative embodiment, the second well 13 may be placed inside a third well that provides electrical isolation from both the semiconductor body 11 and the first well 12 (referred to as triple well structure typically). In such an embodiment, the third well may be spaced apart from the first well 12. On the other hand, the third well may be abutting on the first well 12 when the third well has an opposite conductivity type to that of the first well 12. In still another embodiment, the second well 13 extends into the semiconductor body 11 from the top surface and is spaced apart from the first well 12. In such an embodiment, the second well 13 may have a conductivity type same as or opposite to that of the first well 12. In still another embodiment where the first well 11 and the second well 12 have opposite conductivities, the first well 11 and the second well 12 may be both formed within the semiconductor body 11 and be structurally contact to each other.

Figure 2:
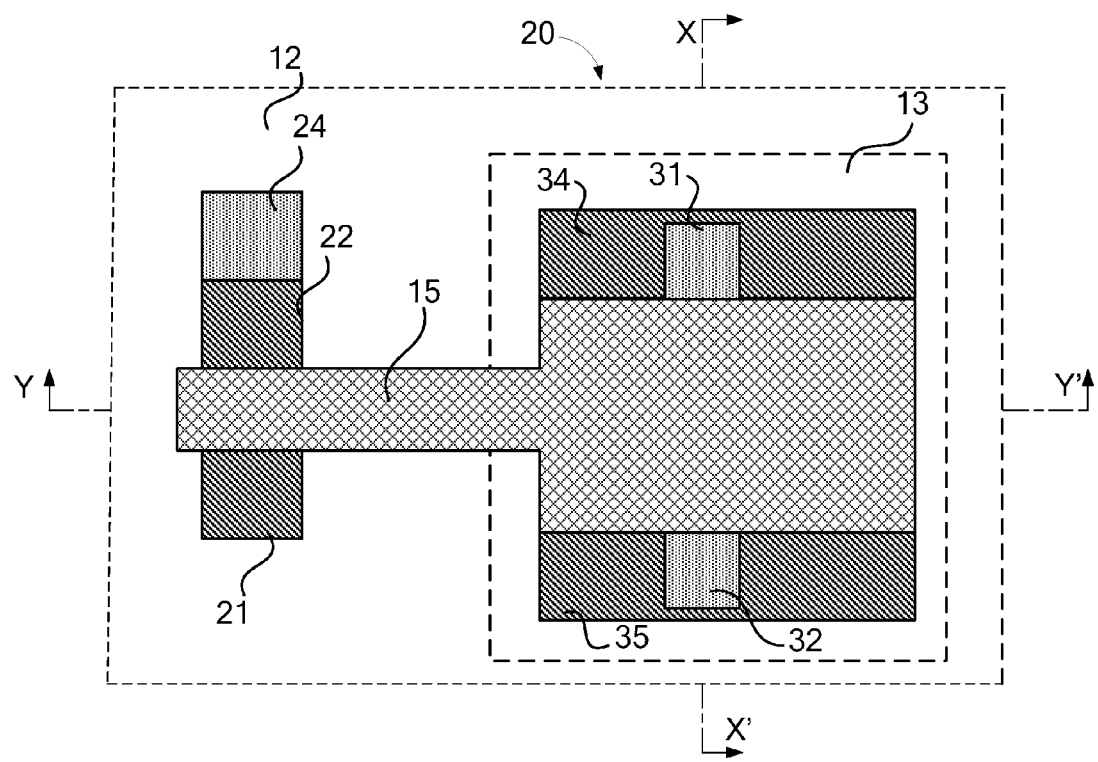
FIG. 2 illustrates a plan view of an EEPROM memory cell 20 in accordance with an embodiment of the present invention.

FIG. 2 illustrates a plan view of an EEPROM memory cell 20 in accordance with an embodiment of the present invention. For purpose of clarity, the like structure of the EEPROM memory cells illustrated in FIG. 1 and FIG. 2 is denoted with the like mark. Now referring to FIG. 2, two N-type feeder regions 31 and 32 are formed bilaterally (X-X') with respect to the second channel region 33 (not shown as being under the floating gate 15) and further adjoining a portion of the second channel region 33 along the longitudinal directional (Y-Y') so as to provide electrons for fast inversion during an erase operation when the second well 13 is biased negatively relative to the first well 12. As shown in FIG. 2, within the second well 13 are further bilaterally (X-X') formed two P-type body contact regions 34 and 35 abutting the left portion of the second channel region 33 as well as the feeder regions 31 and 32 along the longitudinal directional (Y-Y'), so as to provide electrical contact to the second well 13 for biasing the EEPROM memory cell 20. In addition, within the first well 12 is further formed a contact region 24 adjoining the source 22 to provide electrical contact to the source 22 as well as to the first well 12.

Figure 3:
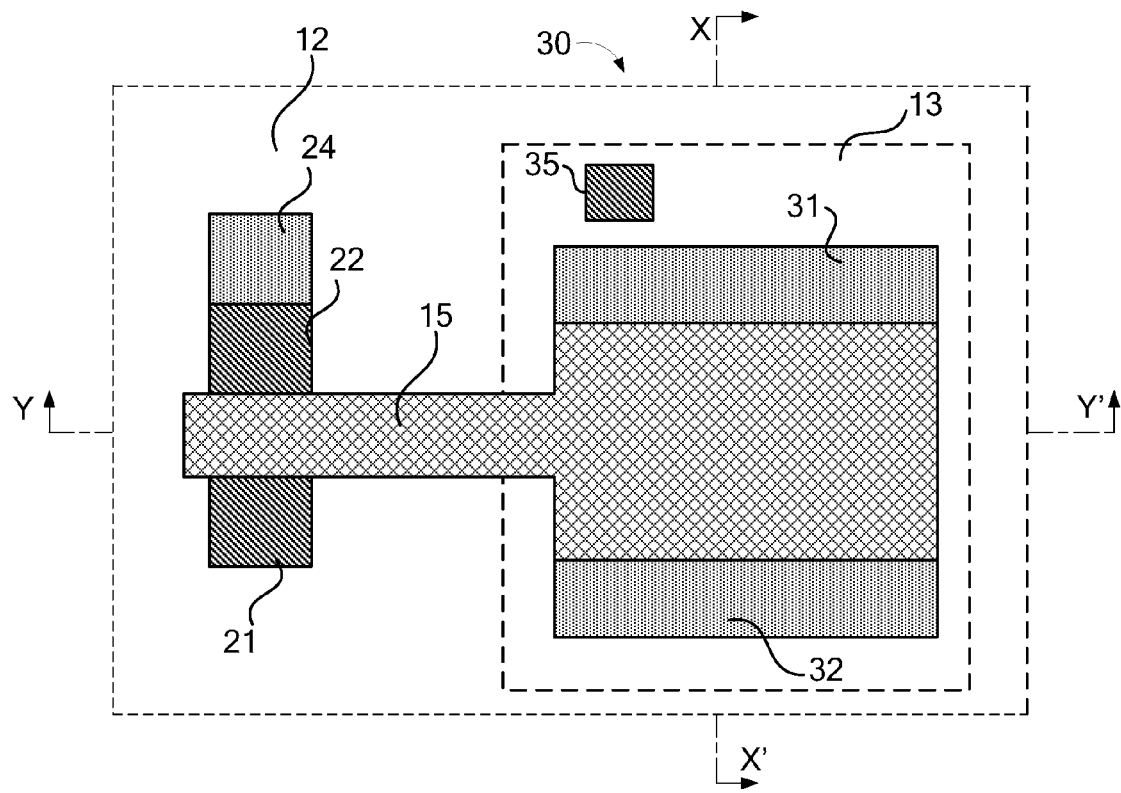
FIG. 3 illustrates a plan view of an EEPROM memory cell 30 in accordance with another embodiment of the present invention.

FIG. 3 illustrates a plan view of an EEPROM memory cell 30 in accordance with another embodiment of the present invention. Referring to FIG. 3, compared with the EEPROM memory cell 20 of FIG. 2, the feeder regions 31 and 32 of FIG. 3 are formed adjoining the entire second channel region 33 along the longitudinal directional (Y-Y'). In addition, a body contact region 35 which may or may not physically abut to the feeder regions 31 or 32 is further formed in the second well 13.

More information will now be set forth regarding the operation of an EEPROM memory cell in accordance with the present invention with reference to FIG. 1~FIG. 3.

During an erase cycle, a voltage Vpp is applied to the first well 12, the drain 21 and the source 22, while an erase voltage Vee lower than the voltage Vpp is applied to the second well 13, and the semiconductor body 11 is grounded (Vsub=0V). For a preferred numerical example, the voltages Vpp and Vee may be respectively set to be 5 volts and −10 volts. However, persons of ordinary skill in the art will realize that the bias voltages may be any combination of values to set up the electric field that is required to initiate Fowler-Nordheim tunneling. For example, the erase voltage Vee may be set to be a positive one much smaller than the voltage Vpp. Through the erase operation, the charges stored in the floating gate 15 are removed substantially entirely or significantly, putting the EEPROM memory cell 10 in a first logic state, such as logic 1.

In operation, the erase voltage Vee applied on the second well 13 induces a voltage potential onto the floating gate 15 through capacitive coupling. The voltage potential on the floating gate 15 may be slightly different from the voltage Vee, depending on the coupling ratio between the floating gate 15 and the coupler region. Thus, the region between the first channel region 23 and the floating gate 15 has a strong electrical gradient that attracts the electrons trapped in the floating gate 15. The electrons tunnel through the insulation layer 14 with the well known Fowler-Nordheim tunneling and are thus removed from the floating gate 15.

During the erase operation, a depletion layer in the second channel region 33 is formed by removing the mobile holes and leaving the fixed ions in the space charge region. The depletion width expands until an inversion layer is formed by attracting the mobile electrons at the interface between the coupler region and the insulation layer 14. Compared with the conventional EEPROM memory cells, the mobile electrons of the EEPROM memory cell of the present invention are additionally provided by the N-type feeder regions 31 and 32 except by the second well 13. That is, the feeder regions 31 and 32 help to supply surface inversion electrons during the erase operation. As mobile electrons are the majority carriers in the N-type feeder regions 31 and 32, the inversion layer is formed much faster, which in turn results in a narrower depletion layer, thus providing a larger coupling ratio between the coupler region and the floating gate 15. As a result, the absolute value of the erase voltage Vee applied in the coupler region can be reduced with a given erase time, as can the time required to erase the EERPROM cell with a given erase voltage. Additionally, the non-linearity of the erase threshold voltage Vte applied to the coupler region to form the second channel region as a function of the erase voltage Vee, the erase time, temperature and/or process variation is also reduced, which can greatly simplify the design and improve the manufacturability and yield of the design as under-erase and over-erase situations can be more easily avoided with the present invention.

Table 1 below provides the test results of the erase threshold voltage to the erase voltage Vee under the erase bias condition of Vsub=0, Vpp=3V with an erase time of 10 ms. In table 1, Vte1 represents the erase threshold voltage of the prior art EEPROM memory cell with no feeder regions, while Vte2 represents the erase threshold voltage of the EEPROM memory cell with feeder regions of the present invention.

TABLE 1

| Vee(V) | Vte1(V) | Vte2(V) |
|---|---|---|
| −19 | −0.4 | −2.8 |
| −18 | 0.2 | −1.9 |
| −17 | 0.4 | −0.7 |
| −16 | 0.5 | 0 |
| −15 | 0.8 | 0.7 |

Figure 4:
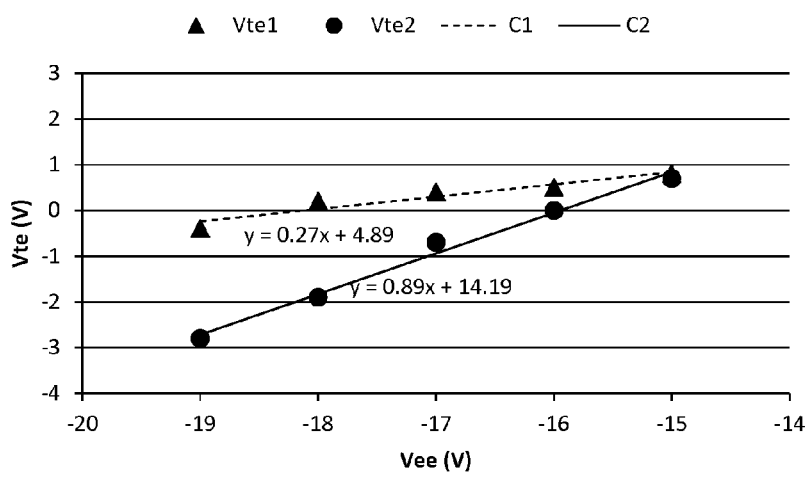
FIG. 4 graphically illustrates the test results of the erase threshold voltage of the EEPROM memory cell 10 over the erase voltage according to table 1.

FIG. 4 graphically illustrates the test results according to table 1 for better comparison between the prior art EEPROM memory cell and the EEPROM memory cell of the present invention. In FIG. 4, distribution indicated with triangles corresponds to the erase threshold voltage Vte1, while distribution indicated with dots corresponds to the erase threshold voltage Vte2. In addition, dash line C1 (y=0.27x+4.89) and solid line C2 (y=0.89x+14.19) respectively show the trends of the erase threshold voltage without and with feeder regions formed inside the second well 13. As indicated by the slope coefficients of the trend lines C1 and C2, the coupling ratio of the present EEPROM memory cell with feeder regions is approximately increased to 90% from an approximate 30% of the convention EEPROM memory cell with no feeder regions. In addition, as can be observed from the trend lines C1 and C2 and the distributions Vte1 and Vte2, the linearity of the erase threshold voltage to the erase voltage Vee is also improved in the present invention.

Figure 5:
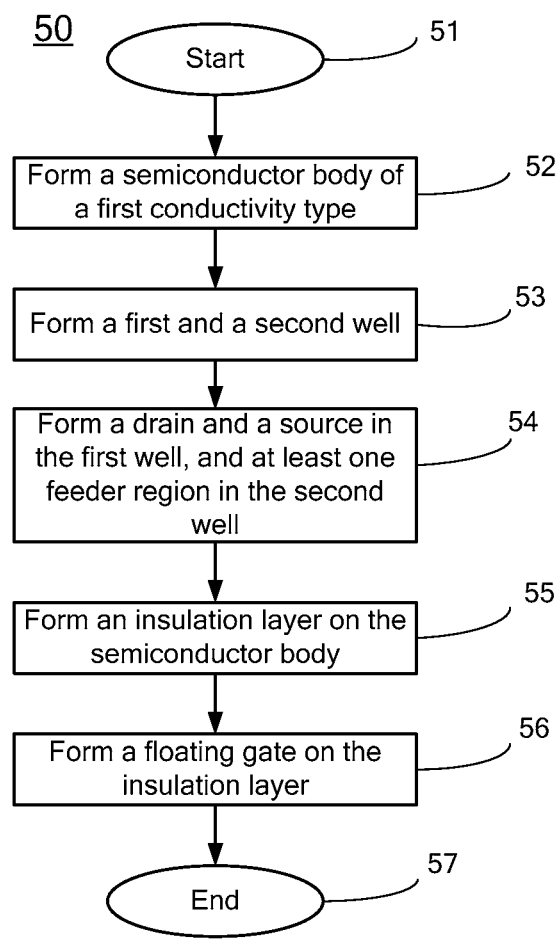
FIG. 5 illustrates a method 50 of fabricating an EEPROM memory cell in accordance with an embodiment of the present invention.

FIG. 5 illustrates a method 50 of fabricating an EEPROM memory cell in accordance with an embodiment of the present invention. The method 50 comprises steps 51~57. After the fabrication method starts in step 51, a semiconductor body having a first conductivity type and a top surface is provided in step 52, wherein the first conductivity type may be P-type or N-type. In one embodiment, the semiconductor body may comprise a substrate, an epitaxial layer growing on a substrate, a buried layer or any appropriate structure and/or material.

In the next step 53, a first well and a second well are formed through appropriate fabrication techniques, for example, diffusion, implantation and/or annealing etc. In one embodiment, the first well has a second conductivity type opposite to that of the semiconductor body, and the second well of the first conductivity type is embedded within the first well and is thus isolated from the semiconductor body. The embedded configuration enables a smaller cell size as less space is required between the first well and the second well having two different conductivity types than that between the first well and the second well with the same conductivity type. In addition, it enables the operation of the second well at electrical potentials above or below that of the semiconductor body without forward-biasing the diode formed between the second well and the semiconductor body, which in turn can enable a novel, simpler or smaller control scheme and driving design for the second well. In an alternative embodiment, both the first well and the second well are formed inside the semiconductor body and are isolated from each other, wherein the first well and the second well may have the same or opposite conductivity type. In still another embodiment, the first well and the second well are fabricated within the semiconductor body and are in contact with each other, wherein the first well and the second well have opposite conductivity types.

In step 54, it is performed to form a drain and a source inside the first well as well as at least one feeder region inside the second well via, for example, masking, patterning and implantation/diffusion etc. The drain and the source are separated from each other and a first channel region is defined therebetween. The at least one feeder region extends from the top surface of the semiconductor body into the second well and a second channel region is defined as extending from the top surface of the semiconductor body into the second well and adjoining the at least one feeder region. The number of the at least one feeder region may be any value of a natural number, like 1, 2 or a number larger than 2. In one embodiment, step 54 may further comprise forming body contact regions in the first and second wells. The body contact region in the second well may be electrically connected to the at least one feeder region in a preferred embodiment.

In step 55, an insulation layer, e.g., an oxide layer, is formed (e.g., via deposition) on the top surface of the semiconductor body. And in step 56, a floating gate is formed on the insulation layer and over the first channel region and the second channel region, forming an uninterrupted conducting path from the second well to the first well. In a preferred embodiment, the floating gate is continuously doped with the same conductivity type as the drain and the source, except small regions adjacent to the at least one feeder regions. In an alternative embodiment, the portion of the floating gate overlapping the first well is doped with the same conductivity type as the drain and the source, while the left portion overlapping the second well is doped with the same conductivity type as the at least one feeder region. And the fabrication method ends in step 57.

With the at least one feeder region providing majority carriers to the second channel region, a portion of the second channel region adjoining the top surface of the semiconductor body is fast inverted during an erase operation, thus providing a large and time independent coupling ratio between the second well and the floating gate, which in turn reduces the absolute value of an erase voltage applied in the second well as well as the time required to erase the EERPROM cell with other parameters fixed.

Persons of ordinary skill in the art will recognize that the aforementioned fabrications steps may be achieved by different process techniques. Further, the fabrication of the EEPROM memory cell may be accomplished with a different sequence of process steps, for example, the doping of the floating gate may be accomplished in the same process step of forming the drain and the source. Still yet, it should be noted that each step shown in FIG. 5 does not necessarily mean the actions comprised in the step is accomplished simultaneously, for example, the step 54 of forming the drain, the source and the at least one feeder region may be done by forming the drain and the source first, then forming the at least one feeder regions after the insulation layer and the floating gate are formed.

It will be appreciated by persons skilled in the art that the present invention is not limited to what has been particularly shown and described herein above. Rather the scope of the present invention is defined by the claims and includes both combinations and sub-combinations of the various features described hereinabove as well as variations and modifications thereof which would occur to persons skilled in the art upon reading the foregoing description and which are not in the prior art.

What is claimed is:

1. An electrically erasable programmable read only memory (EEPROM) cell formed in a semiconductor body having a top surface, the EEPROM memory cell comprising:
   a first well and a second well both adjacent to the top surface of the semiconductor body;
   a drain and a source formed in the first well and spaced apart from each other, wherein a first channel region is defined between the source and the drain;
   a second channel region defined as extending from the top surface of the semiconductor body into the second well;
   a floating gate insulatively formed over the first channel region and the second channel region and forming an uninterrupted conducting path extending from the second well to the first well; and
   at least one feeder region formed in the second well, wherein the at least one feeder region has a conductivity type opposite to that of the second well and is configured to provide the majority carriers thereof to the second channel region so that the portion of the second channel region proximate the top surface of the semiconductor body is inverted during an erase operation, and wherein a portion of the at least one feeder region laterally extends below the floating gate, and the floating gate comprises a region overlapping the at least one feeder region and a remaining region, and wherein the region of the floating gate overlapping the at least one feeder region is doped with the same conductivity type as that of the at least one feeder region and the remaining region of the floating gate is doped with the opposite conductivity type to that of the at least one feeder region.

2. The EEPROM memory cell of claim 1, wherein the at least one feeder region extends from the top surface of the semiconductor body into the second well and is in contact with the second channel region.

3. The EEPROM memory cell of claim 1, wherein the at least one feeder region comprises two separated feeder regions bilaterally formed with respect to the second channel region.

4. The EEPROM memory cell of claim 3, wherein the two separated feeder regions respectively adjoin the entire second channel region along the longitudinal direction of the second channel region.

5. The EEPROM memory cell of claim 3, wherein the EEPROM memory cell further comprises two separated body contact regions bilaterally formed with respect to the second channel region in the second well, and wherein the two separated feeder regions are respectively in contact with a portion of the second channel region and the two separated body contact regions are respectively in contact with the remaining portion of the second channel region and the two separated feeder regions along the longitudinal direction of the second channel region.

6. The EEPROM memory cell of claim 1, wherein the EEPROM memory cell further comprises at least one body contact region formed in the second well and electrically shorted to the at least one feeder region, wherein the at least one body contact region has a conductivity type same as that of the second well.

7. The EEPROM memory cell of claim 1, wherein the EEPROM memory cell further comprises an insulation layer formed on the semiconductor body, and wherein the floating gate is formed on the insulation layer.

8. The EEPROM memory cell of claim 1, wherein the second well is formed inside the first well and has a conductivity type opposite to that of the first well.

9. A method of fabricating an electrically erasable programmable read only memory (EEPROM) cell comprising:
providing a semiconductor body having a top surface;
forming a first well and a second well adjoining the top surface of the semiconductor body, wherein a second channel region is defined as extending from the top surface of the semiconductor body into the second well;
forming a drain and a source both within the first well, wherein the drain and the source are spaced apart from each other and a first channel region is defined therebetween;
forming at least one feeder region of a conductivity type opposite to that of the second well, wherein the at least one feeder region is formed inside the second well and is configured to provide the majority carriers to the second channel region so that a portion of the second channel region adjoining the top surface of the semiconductor body is inverted during an erase operation;
forming a floating gate over the first channel region and the second channel region, wherein the floating gate forms an uninterrupted conducting path from the second well to the first well;
wherein a portion of the at least one feeder region laterally extends below the floating gate, and the floating gate comprises a region overlapping the at least one feeder region and a remaining region, and wherein the region of the floating gate overlapping the at least one feeder region is doped with the same conductivity type as that of the at least one feeder region and the remaining region of the floating gate is doped with the opposite conductivity type to that of the at least one feeder region.

10. The method of claim 9, wherein the at least one feeder region is in contact with the second channel region and extends from the top surface of the semiconductor body into the second well.

11. The method of claim 9, wherein the at least one feeder region comprises two separated feeder regions bilaterally formed with respect to the second channel region.

12. The method of claim 11, wherein the two separated feeder regions are formed respectively in contact with the entire second channel region along the longitudinal direction of the second channel region.

13. The method of claim 11, wherein the method further comprises forming two separated body contact regions bilaterally with respect to the second channel region in the second well, and wherein the two separated feeder regions are formed respectively in contact with a portion of the second channel region and the two separated body contact regions are formed respectively in contact with the remaining portion of the second channel region and the two separated feeder regions along the longitudinal direction of the second channel region.

14. The method of claim 9, wherein the method further comprises forming at least one body contact region electrically shorted to the at least one feeder region, wherein the at least one body contact region has a conductivity type same as that of the second well.

15. The method of claim 9, wherein the method further comprises forming an insulation layer on the semiconductor body and forming the floating gate on the insulation layer.

16. The method of claim 9, wherein the second well is formed inside the first well and has a conductivity type opposite to that of the first well.

17. An electrically erasable programmable read only memory (EEPROM) cell formed in a semiconductor body having a top surface, the EEPROM memory cell comprising:
a first well and a second well both adjacent to the top surface of the semiconductor body;
a drain and a source formed in the first well and spaced apart from each other, wherein a first channel region is defined between the source and the drain;
a second channel region defined as extending from the top surface of the semiconductor body into the second well;
a floating gate insulatively formed over the first channel region and the second channel region and forming an uninterrupted conducting path extending from the second well to the first well; and
at least one feeder region formed in the second well, wherein the at least one feeder region has a conductivity type opposite to that of the second well and is configured to provide the majority carriers thereof to the second channel region so that the portion of the second channel region proximate the top surface of the semiconductor body is inverted during an erase operation, wherein the at least one feeder region comprises two separated feeder regions bilaterally formed with respect to the second channel region, and wherein the EEPROM memory cell further comprises two separated body contact regions bilaterally formed with respect to the second channel region in the second well, and wherein the two separated feeder regions are respectively in contact with a portion of the second channel region and the two separated body contact regions are respectively in contact with the remaining portion of the second channel region and the two separated feeder regions along the longitudinal direction of the second channel region.

18. The EEPROM memory cell of claim 17, wherein the at least one feeder region extends from the top surface of the semiconductor body into the second well and is in contact with the second channel region.

19. The EEPROM memory cell of claim 17, wherein a portion of the at least one feeder region laterally extends below the floating gate.

20. The EEPROM memory cell of claim 17, wherein the second well is formed inside the first well and has a conductivity type opposite to that of the first well.

* * * * *